United States Patent
Howard et al.

(10) Patent No.: US 6,396,122 B1
(45) Date of Patent: May 28, 2002

(54) METHOD FOR FABRICATING ON-CHIP INDUCTORS AND RELATED STRUCTURE

(75) Inventors: David Howard; Bin Zhao; Q. Z. Liu, all of Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/658,483

(22) Filed: Sep. 8, 2000

(51) Int. Cl.⁷ .............................................. H01L 29/00
(52) U.S. Cl. ........................ 257/531; 257/528; 257/641; 257/651; 257/746; 257/762
(58) Field of Search ................................ 257/528, 531, 257/746, 758, 762, 765, 766, 773, 641, 644, 645, 650, 651

(56) References Cited

U.S. PATENT DOCUMENTS 5,651,841 A * 7/1997 Moro et al. .................. 148/309
6,166,422 A * 12/2000 Qian et al. ................... 257/531
6,166,439 A * 12/2000 Cox ............................ 257/758

FOREIGN PATENT DOCUMENTS

JP 06005605 A * 1/1994

* cited by examiner

*Primary Examiner*—Nathan Flynn
*Assistant Examiner*—Remmon R. Fordé
(74) *Attorney, Agent, or Firm*—Farjami & Farjami LLP

(57) ABSTRACT

According to various disclosed embodiments, a conductor is patterned in a dielectric. The conductor can be patterned, for example, in the shape of a square spiral. The conductor can comprise, for example, copper, aluminum, or copper-aluminum alloy. The dielectric can be, for example, silicon oxide or a low-k dielectric. A spin-on matrix containing high permeability particles is then deposited adjacent to the patterned conductor. The high permeability particles comprise material having a permeability substantially higher than the permeability of the dielectric. The high permeability particles can comprise, for example, nickel, iron, nickel-iron alloy, or magnetic oxide. As a result, an inductor having a high inductance value is achieved without lowering the quality factor of the inductor.

24 Claims, 10 Drawing Sheets

METHOD FOR FABRICATING ON-CHIP INDUCTORS AND RELATED STRUCTURE

The present application is related to a co-pending application entitled "method for fabrication of high inductance inductors and related structure," filed on or about Aug. 24, 2000, Ser. No. 09/649,442 and assigned to the assignee of the present application. The disclosure in that co-pending application is hereby incorporated fully be reference into the present application.

BACKGROUND OF THE INVENTION

1. Field of the Invention

The present invention is generally in the field of semiconductor chips. In particular, the present invention is in the field of inductors used in semiconductor chips.

2. Background Art

FIG. 1 shows a top view of a conventional inductor 100 on an area of a semiconductor die. The square configuration of the inductor shown in FIG. 1 is commonly used in semiconductor dies and inductor 100 is commonly referred to as a "square spiral inductor."

The four metal turns of inductor 100 are referred to by numerals 104, 106, 108, and 110. Metal turns 104, 106, 108, and 110 are patterned within dielectric 102 in a manner known in the art. Thus, the areas of dielectric 102 which are flanked by metal turns 104, 106, 108, and 110 are within the electromagnetic field that will be created by metal turns 104, 106, 108, and 110. Dielectric 102 can be silicon dioxide or a low-k dielectric. Metal turns 104, 106, 108, and 110 can be aluminum, copper, or a copper-aluminum alloy.

Metal turns 104, 106, 108, and 110 are patterned on one metal layer. Metal turn 110 comprises connection terminal 112. Connection terminal 112 is thus a part of inductor 100 while also functioning as a first connection terminal of inductor 100. Connection terminal 114 is also a part of inductor 100 and functions as a second connection terminal of inductor 100. However, connection terminal 114 is patterned on a different metal layer of the die than the rest of inductor 100 to allow connection terminal 114 to cross underneath or above metal turns 104, 106, 108, and 110 of inductor 100 without shorting the metal turns together. An electrical connection between connection terminal 114 and the remainder of the metal used to fabricate metal turns 104, 106, 108, and 110 of inductor 100 is then provided by a via. Connection terminal 114 is shown in a different shade to show that it is situated on a different metal layer of the die than the remainder of the metal used to fabricate inductor 100. The width of inductor 100 is referred to by numeral 116.

The inductance value of a square spiral inductor, such as inductor 100, is determined by the empirical equation:

$$L \cong 0.38\mu_0 n^2 d \qquad \text{(Equation 1)}$$

where L is the net effective inductance, $\mu_0$ is the permeability of free space ($\mu_0 = 4\pi(10^{-13})$ henrys/$\mu$m), n is the number of metal turns, d is the "spiral diameter" which is a term used to refer to width 116 of inductor 100, and 0.38 is a coefficient which is derived empirically from the shape of the inductor. As an example, if a circuit on a semiconductor chip required a square spiral inductor with a value of 30 nano henrys and a pitch of one turn per 5.0 microns, the inductor would require 17 metal turns and would have a spiral diameter of 217 microns.

On-chip inductors can be used in mixed-signal circuits and in RF applications such as receiver chips in wireless telephone technologies. Typical inductor values for a square spiral inductor used in such applications range from 1 to 100 nano henrys. It can be seen from the above example that to achieve these desired values of inductance, a very large area of the chip has to be set aside for the inductor. In fact, these inductors tend to dominate the chip, leaving less area for other circuit elements. Thus, the inductor's size limits the use of on-chip inductors for RF and mixed-signal circuits.

As can be seen from Equation 1, device engineers can achieve a higher inductance value by increasing the number of metal turns of the inductor. However, as the number of metal turns increases, the overall resistance of the metal turns will also increase due to the increasing length of the metal turns. The increased resistance of the metal turns results in a lower quality factor ("Q"), since the quality factor is determined by Q=L/R, where L is the inductance and R is the resistance inherent in the inductor. For a given inductance, as the resistance increases, the quality factor decreases.

Alternatively, the inductance can be increased by increasing the spiral diameter of the on-chip inductor. However, this would make the on-chip inductor even larger and would require more chip space. As explained above, square spiral inductors already dominate the chip. Therefore, there is little available space on the chip for even larger inductors.

Thus, it is seen that there are problems associated with both of the above described methods for increasing the inductance of a square spiral inductor. Either the size of the inductor will increase further by increasing the spiral diameter of the inductor, or the quality factor will go down as a result of an increased number of metal turns within a given spiral diameter of the inductor.

As a result of these problems, device engineers have been trying to achieve a higher inductance without an increase in the space occupied by the inductor on the chip and without a decrease in the quality factor of the inductor. Thus, variations in the layout of the on-chip inductor have been made to optimize the inductance value and quality factor of the inductor.

One such variation is the "hollow spiral inductor." This on-chip inductor is similar to the square spiral inductor except that some of the metal turns at the center of the inductor are removed while the outer metal turns remain. The missing center metal turns result in lower overall resistance of the inductor and therefore a higher quality factor. Thus, by using a hollow spiral inductor instead of a square spiral inductor, a higher quality factor can be achieved for an on-chip inductor with a given spiral diameter and a given number of metal turns.

The inductance of a hollow spiral inductor is determined by the empirical equation:

$$L \cong (37.5\mu_0 n^2 a^2)/(11d - 14a) \qquad \text{(Equation 2)}$$

where L is the net effective inductance, $\mu_0$ is the permeability of free space ($\mu_0 = 4\pi(10^{-13})$ henrys/$\mu$m), n is the number of metal turns, d is the "spiral diameter" which is substantially the same as the width of the hollow spiral inductor, a is the "spiral radius" which is arrived at by empirical calculations and is equal to or slightly less than one half of the value of the spiral diameter d, and 37.5 is a coefficient that has been determined empirically.

Similarly, other variations in the layout of on-chip inductors have been used to reduce the size of the on-chip inductor while maintaining a high inductance. However, the reduction in the size of on-chip inductors that has been achieved by these variations in the layout of the inductor has been outpaced by the continuing "scaling down" of the chip size over time. Thus, the continuing trend towards smaller chips has resulted in a need for even smaller on-chip inductors.

Another shortcoming with known inductors, such as inductor 100, is that when for various reasons it is permissible to have a smaller inductance, a "scaled down" value of inductance cannot be easily achieved by reducing the number of turns n. The reason is that when the number of turns n decreases, the inductance decreases in proportion to a decrease in the value of $n^2$. This decrease in the value of inductance is desirable, but it is always accompanied by a degradation in the quality factor Q. The reason is that a reduction in the number of turns n causes a reduction in the value of the resistance R inherent in the inductor in linear proportion to n. As such, the quality factor Q which is given by L/R, is also reduced by a factor of n. This decrease in quality factor Q is clearly undesirable and is a result of an attempt to reduce the value of the inductance L by simply reducing the number of turns n.

Thus, there is a serious need in the art for an on-chip inductor that occupies a smaller space on the semiconductor die, while having at the same time a high value of inductance and a high quality factor.

SUMMARY OF THE INVENTION

The present invention is directed to method for fabricating on-chip inductors and related structure. The invention addresses and overcomes the serious need in the art for an on-chip inductor that occupies a smaller space on the semiconductor die, while having at the same time a high value of inductance and a high quality factor.

According to various embodiments of the invention, a conductor is patterned in a dielectric. The conductor can be patterned, for example, in the shape of a square spiral. The conductor can comprise, for example, copper, aluminum, or copper-aluminum alloy. The dielectric can be, for example, silicon oxide or a low-k dielectric. A spin-on matrix containing high permeability particles is then deposited adjacent to the patterned conductor. The high permeability particles comprise material having a permeability substantially higher than the permeability of the dielectric. The high permeability particles can comprise, for example, nickel, iron, nickel-iron alloy, or magnetic oxide. As a result, an inductor having a high inductance value is achieved without lowering the quality factor of the inductor.

DETAILED DESCRIPTION OF THE INVENTION

The present invention is directed to method for fabricating on-chip inductors and related structure. The following description contains specific information pertaining to different types of materials, layouts, dimensions, and implementations of the invention's inductor. One skilled in the art will recognize that the present invention may be practiced with material, layout, or dimensions different from those specifically discussed in the present application. Moreover, some of the specific details of the invention are not discussed in order to not obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

By way of background, when a material is placed within the electromagnetic field of an inductor, the magnetic dipoles of the material interact with the magnetic field created by the inductor. If the magnetic field of the inductor is reinforced by the magnetic moments, a larger number of flux lines are created, thus increasing the inductance. The ability of a material to reinforce the magnetic field of the inductor is determined by the permeability of the material. Permeability is the property of a material which describes the magnetization developed in that material when excited by a magnetic field.

Figure 1:
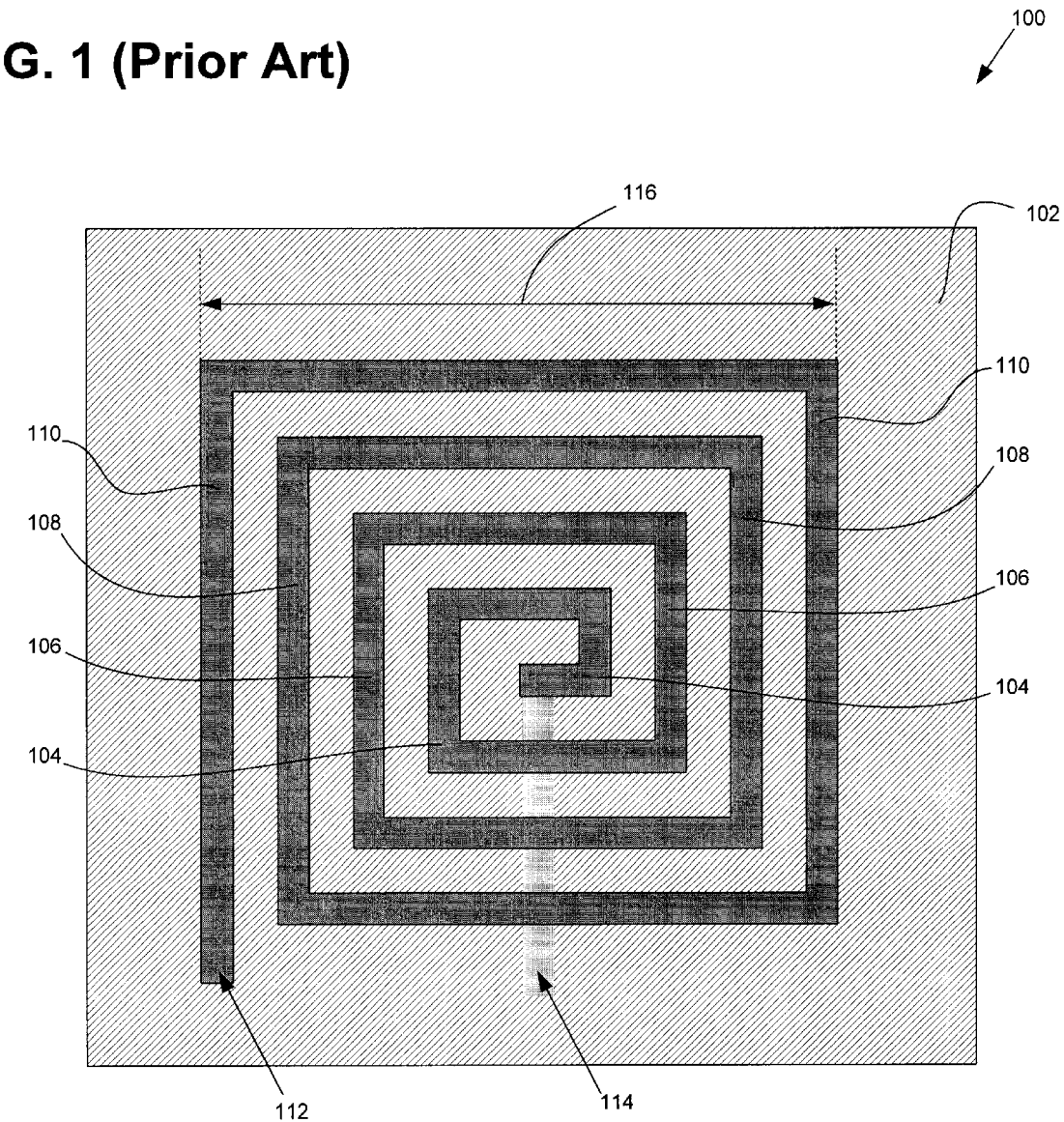
FIG. 1 illustrates a top view of an inductor on an area of a semiconductor die.

In the discussion of FIG. 1 in the background section of this application the permeability of dielectric 102, which is situated within the electromagnetic field that will be created by metal turns 104, 106, 108, and 110 of inductor 100, was not included in Equation 1. This was because dielectric 102 was silicon dioxide or a low-k dielectric material in the example shown in FIG. 1 and the permeability of silicon dioxide or a low-k dielectric is approximately equal to 1.0. Therefore, Equation 1 would apply to materials, such as silicon dioxide, whose permeability is approximately equal to 1.0.

However, if other materials with higher values of permeability are placed within the magnetic field of the inductor, the net effective inductance of square spiral inductor 100 is calculated by the equation:

$$L \cong 0.38 \mu_0 \mu n^2 d \qquad \text{(Equation 3)}$$

where L is the net effective inductance, $\mu_0$ is the permeability of free space ($\mu_0 = 4\pi(10^{-13})$ henrys/$\mu$m), $\mu$ is the relative permeability of the material placed within the magnetic field of the inductor, n is the number of metal turns, d is the "spiral diameter" which is a term used to refer to width 116 of inductor 100, and 0.38 is a coefficient which is derived empirically from the shape of the inductor.

It is seen from Equation 3 that the net effective inductance can be increased by placing a material with a high permeability within the magnetic field of the inductor. There are many classes of materials that have very high permeability. For example, a certain class of metals, including iron and nickel, have relative permeability values in the thousands. Some alloys have even higher relative permeability values, some in the millions. For example, nickel-iron alloys have a much higher permeability than iron alone. In addition, some magnetic oxides also have high values of relative permeability. These magnetic oxides are usually made of ferrites, i.e. crystalline minerals composed of iron oxide in combination with some other metal. As an example, a type of ferrite magnetic oxide having a spinel structure can be used as a high permeability material. Thus, if a high permeability material, such as one of those specifically mentioned above, is placed within the magnetic field of the inductor, $\mu$ in Equation 3 will be high, resulting in a high inductance value for a given spiral diameter and a given number of metal turns. In the present application, a high permeability material, such as the ones mentioned above, is also referred to as a "permeability conversion material."

The present invention increases the inductance of an inductor with a given number of turns and a given spiral diameter by depositing particles of high permeability material within the magnetic field of the inductor. These high permeability particles situated within the magnetic field of the inductor will increase the inductance value of the inductor, as seen from equation 3. As an example, small particles of high permeability material such as iron or nickel can be deposited between, underneath, or on top of the metal turns of the inductor, i.e. into the magnetic field of the inductor. In the alternative, particles of a metal alloy can be deposited into the magnetic field of the inductor. This metal alloy deposition may be desirable, as some metal alloys have higher permeability than the individual metals alone.

In one embodiment, a subtractive etch process is utilized to pattern the metal turns of the inductor. The subtractive etch process begins with depositing a blanket layer of a metal, such as aluminum, on a layer of dielectric. Thereafter, the aluminum layer is patterned and etched. The remaining lines of aluminum form a desired pattern. Although aluminum is used in one embodiment, copper or a copper-aluminum alloy may also be used.

In another embodiment, a damascene process is utilized to pattern the inductor's metal turns. The term "damascene" is derived from the ancient in-laid metal artistry which originated in Damascus. According to the damascene process, trenches are cut into the dielectric and then filled with metal. Then, excess metal over the wafer surface is removed to form desired interconnect metal patterns within the trenches. In one embodiment copper is used as the metal, although aluminum or a copper-aluminum alloy may also be used.

By way of overview, according to the present invention, high permeability particles are added to a flowable material such as hydrogen silsesquioxane ("HSQ"), or spin-on glass ("SOG"). Thus, the flowable material functions as a "spin-on matrix" comprising high permeability particles.

Figure 2:
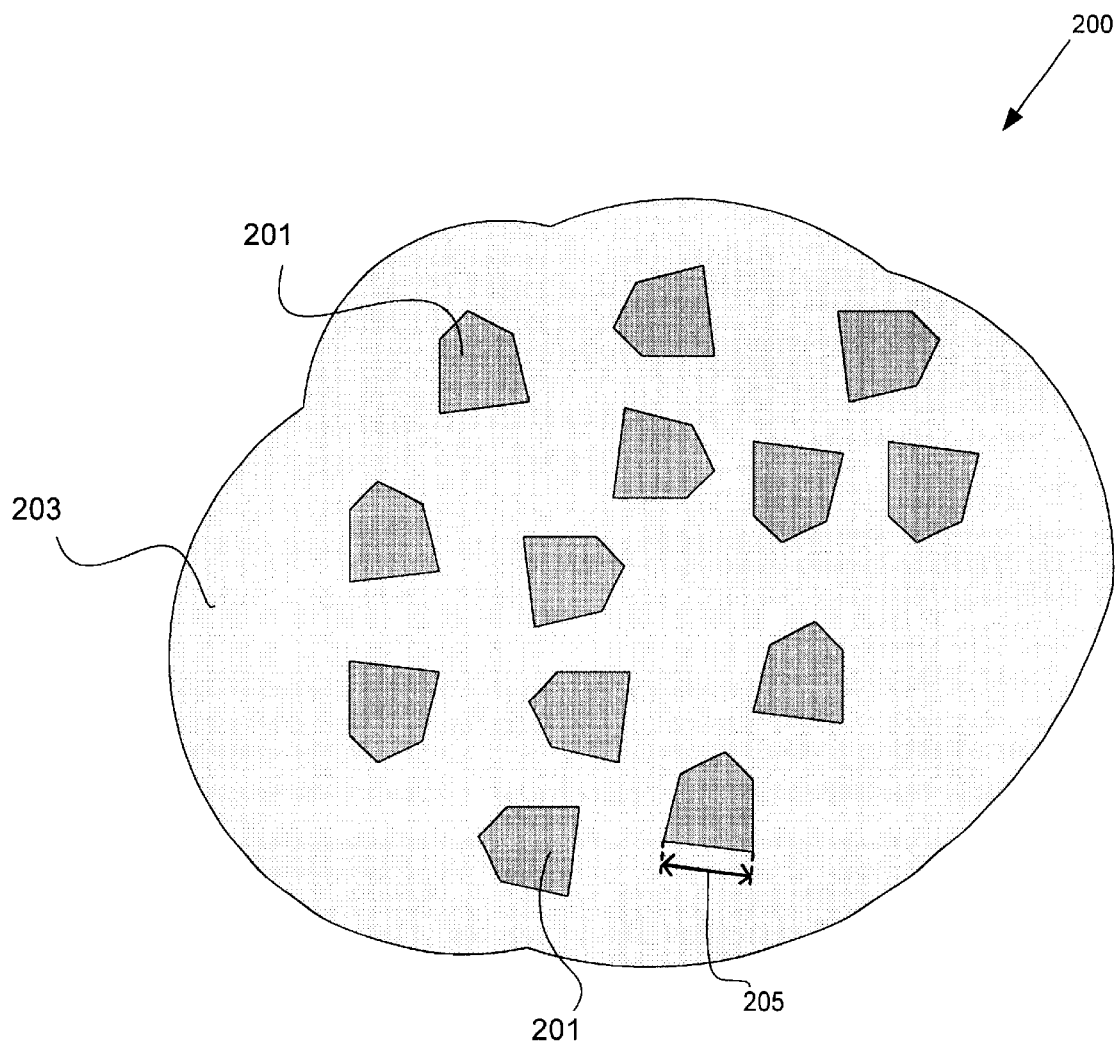
FIG. 2 illustrates an exemplary spin-on matrix comprising particles of high permeability material.

FIG. 2 shows exemplary spin-on matrix 200, which in the present example comprises spin-on glass ("SOG") 203. SOG 203 comprises, for example, silicon dioxide dissolved within a suitable solvent. According to the invention, particles of high permeability material, referred to by numeral 201 and also referred to as "high permeability particles 201" are interspersed within SOG 203. Typical dimension 205 of high permeability particles 201 is chosen to be approximately one tenth of the distance between the metal turns of the inductor in order to facilitate the deposition of high permeability particles 201 between the metal turns of the inductor. As an example, if the distance between the metal turns of the inductor is 2.0 microns, typical dimension 205 of high permeability particles 201 would be approximately 0.2 microns.

Figure 3:
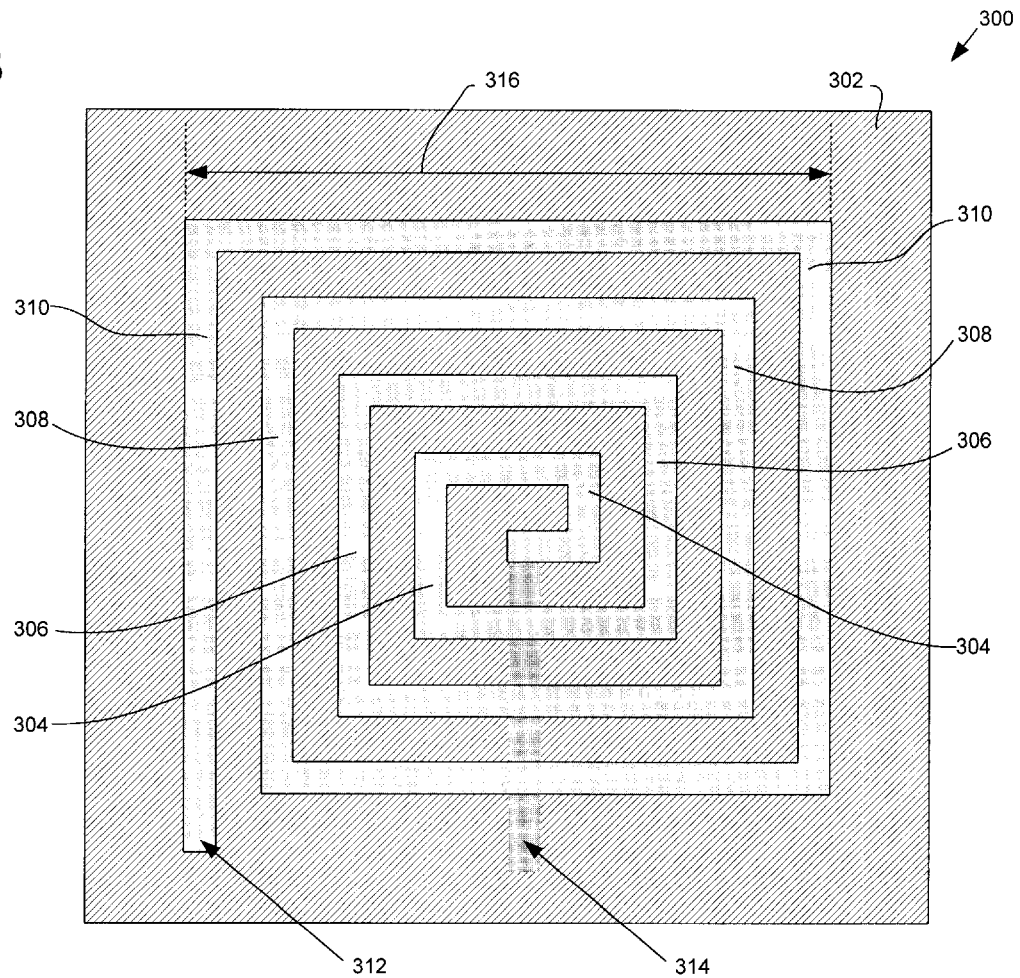
FIG. 3 illustrates a top view of the invention's inductor on an area of a semiconductor die.

FIG. 3 shows a top view of an embodiment of the invention's inductor 300 on an area of a semiconductor die. In this example, the inductor is configured as a square spiral inductor. The four metal turns of inductor 300 are referred to by numerals 304, 306, 308, and 310. In the present embodiment, metal turns 304, 306, 308, and 310 are patterned on top of dielectric 302 utilizing an aluminum subtractive etch process. Dielectric 302 can be silicon dioxide or a low-k dielectric. Metal turns 304, 306, 308, and 310 can be aluminum, copper, or a copper-aluminum alloy.

Metal turns 304, 306, 308, and 310 are patterned out of one metal layer. Metal turn 310 comprises connection terminal 312. Connection terminal 312 is thus a part of inductor 300 while also functioning as a first connection terminal of inductor 300. Connection terminal 314 is also a part of inductor 300 and functions as a second connection terminal of inductor 300. However, connection terminal 314 is patterned on a different metal layer of the die than the rest of inductor 300 to allow connection terminal 314 to cross underneath metal turns 304, 306, 308, and 310 of inductor 300 without shorting the metal turns together.

An electrical connection between connection terminal 314 and metal turn 304 of inductor 300 is then provided, for example, by means of a via. Connection terminal 314 is shown in a different shade to show that it is situated on a different metal layer of the die than the remainder of the metal used to fabricate inductor 300. The width of inductor 300 is referred to in FIG. 3 by numeral 316. In the present embodiment of the invention, the metal turns of inductor 300 are patterned into the topmost metal layer of the semiconductor die. Although the topmost metal layer is used in the present embodiment, the invention could be implemented on any metal layer of the die.

As stated above, FIG. 3 shows a top view of the final structure of an embodiment of the invention's inductor 300 after particles of high permeability material have been deposited within the magnetic field of the inductor. FIGS. 4 through 7B illustrate the various steps in the invention's process to form the high inductance exemplary inductor 300 by showing the respective cross sections of the resulting structures after each process step.

Figure 4:
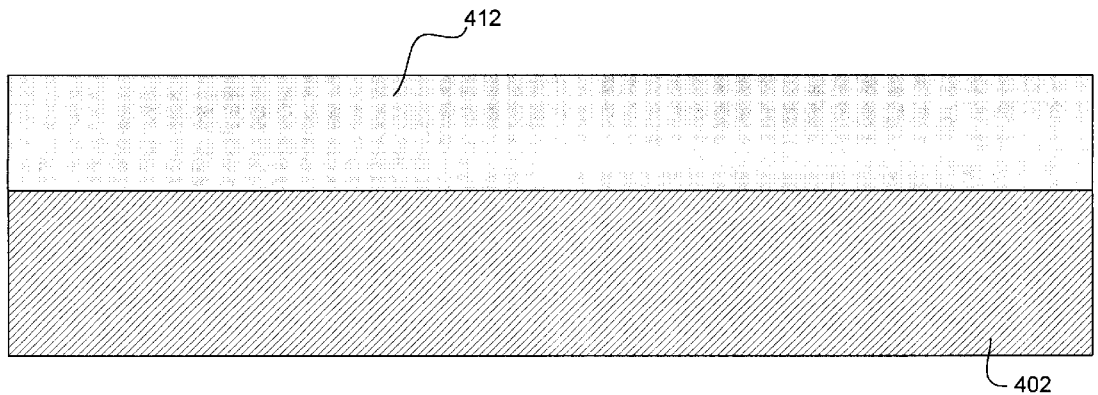
FIG. 4 illustrates a cross section view of a blanket layer of metal situated on top of a dielectric.
Figure 5:
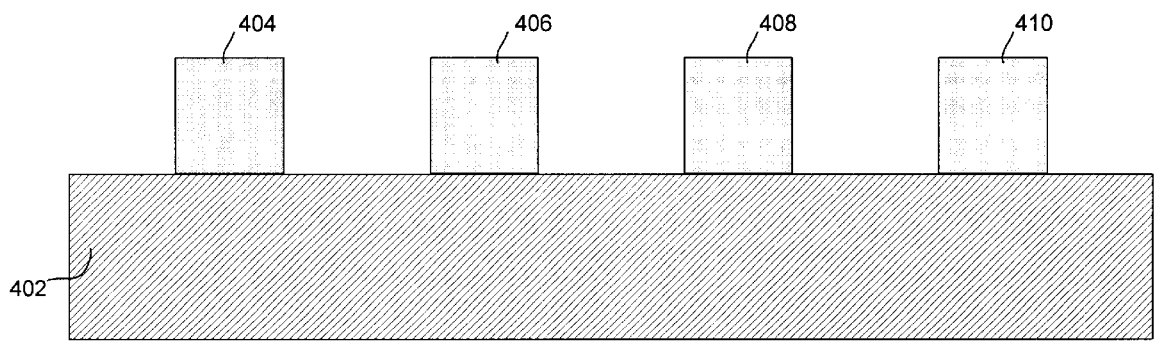
FIG. 5 illustrates a cross section view of the invention's inductor's metal turns after a subtractive etch step.

FIG. 4 shows the result of the first step of the invention's process in the present embodiment. This step includes deposition of a blanket layer of metal 412 on a layer of dielectric 402. As stated above, dielectric 402 can be silicon dioxide or a low-k dielectric and metal 412 can be aluminum. Examples of low-k dielectrics that can be used in the present embodiment are porous silica, fluorinated amorphous carbon, aromatic hydrocarbon, carbon-doped oxide, parylene, polyarylene ether, silsesquioxane, fluorinated silicon dioxide, and diamondlike carbon. All of these dielectrics have a dielectric constant below the widely used dielectrics silicon dioxide which has a dielectric constant of approximately 4.0. FIG. 5 shows the result of the next step in the invention's process in the present embodiment. Metal turns 404, 406, 408, and 410 have been etched within blanket layer of aluminum 412, in a manner known in the art, to form the desired square spiral pattern. Although only respective cross section views of metal turns 404, 406, 408, and 410 are shown in FIGS. 5 through 7B, the cross section views of the metal turns will be referred to as metal turns 404, 406, 408, and 410 for simplicity. Metal turns 404, 406, 408, and 410 in FIGS. 5 through 7B correspond to metal turns 304, 306, 308, and 310 of exemplary inductor 300 in FIG. 3. However, FIGS. 5 through 7B show only the right half of the inductor's metal turns.

Figure 6:
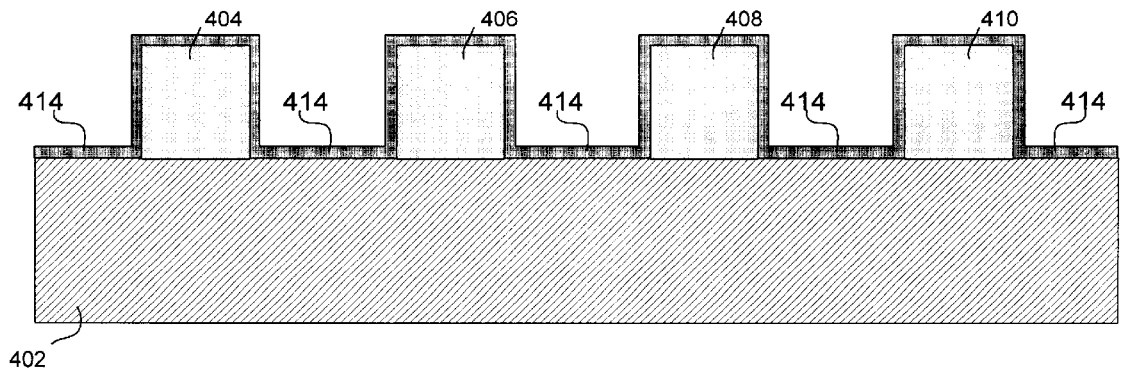
FIG. 6 illustrates a cross section view of the invention's inductor's metal turns after the deposition of a passivation layer.

FIG. 6 shows the result of the next step in the process according to the present embodiment of the invention. Passivation layer 414 is deposited over the top and sides of metal turns 404, 406, 408, and 410 as well as over dielectric 402. The purpose of passivation layer 414 is to provide electrical insulation between metal turns 404, 406, 408, and 410 and the high permeability particles, such as high permeability particles 201, which, in one implementation, are electrically conductive. The insulation provided by passivation layer 414 prevents potential shorting of the metal turns when there is a large number of high permeability particles within the spin-on matrix to be deposited between the metal turns.

Figure 7A:
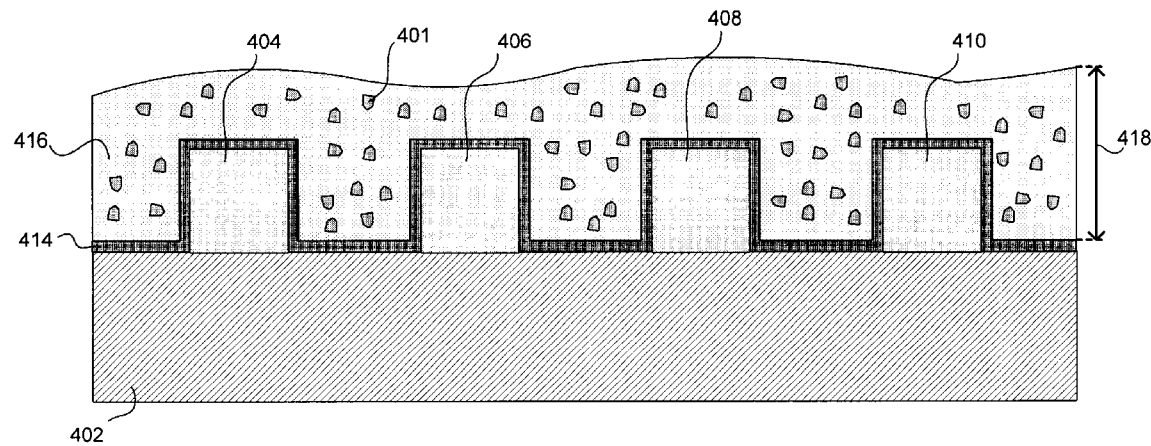
FIG. 7A illustrates a cross section view of the invention's inductor after the deposition of a high viscosity spin-on matrix comprising high permeability particles.
Figure 7B:
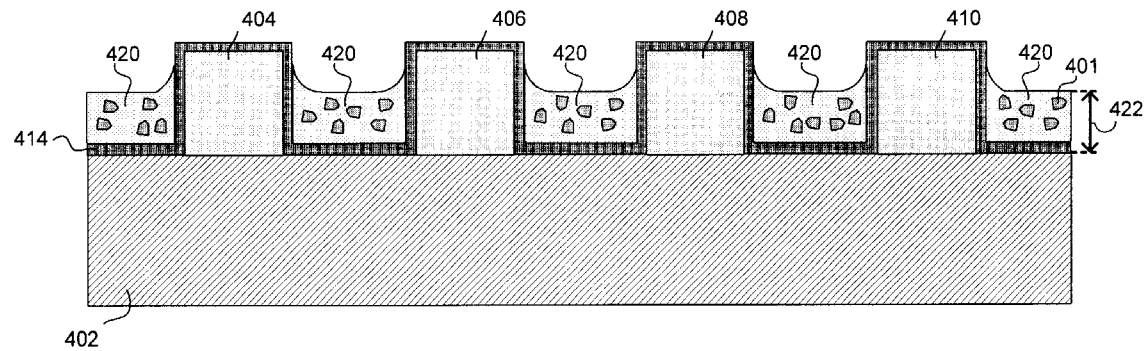
FIG. 7B illustrates a cross section view of one embodiment of the invention's inductor after the deposition of a low viscosity spin-on matrix comprising high permeability particles.
Figure 7C:
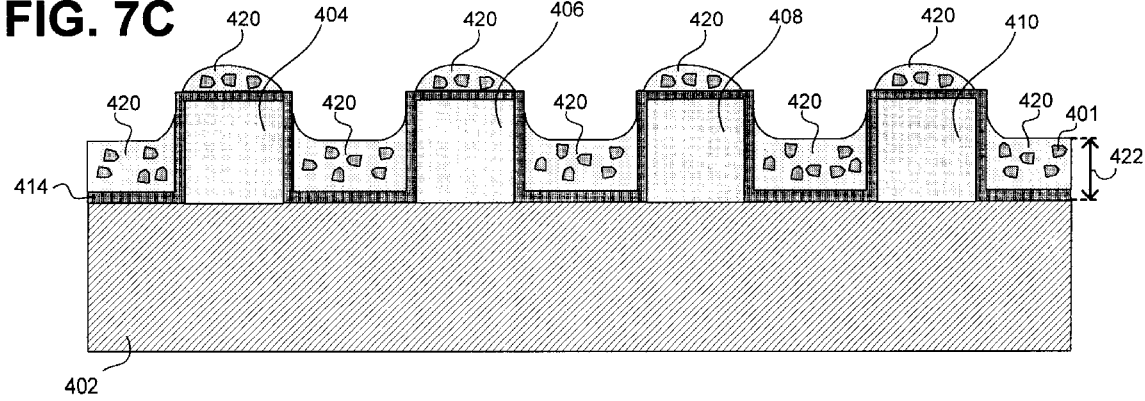
FIG. 7C illustrates a cross section view of another embodiment of the invention's inductor after the deposition of a low viscosity spin-on matrix comprising high permeability particles.

FIGS. 7A, 7B, and 7C show the results of alternative implementations of the next step in the invention's process. FIG. 7A shows the first implementation of this step. In FIG. 7A, spin-on matrix 416 has been deposited over the area of the semiconductor die where the inductor is situated. Spin-on matrix 416 can be "SOG" comprising high permeability particles 401. High permeability particles 401 can be iron, nickel, or a nickel-iron alloy.

As an example of a spin-on process used to deposit spin-on matrix 416, the semiconductor wafer containing the semiconductor die is placed into a spinner machine. Spin-on matrix 416 is dispensed onto the center of the wafer to form a "puddle." The wafer can be static or rotating during the dispensing of the spin-on matrix. The "dispense volume" is determined in a manner known in the art to ensure complete coverage of the semiconductor wafer by spin-on matrix 416. After the "dispense," the spinner is usually accelerated so that spin-on matrix 416 is spread across the surface of the wafer. The spin continues for a period after spin-on matrix 416 has spread across the wafer to allow for drying.

As an alternative to covering the entire semiconductor die with spin-on matrix 416, a masking process can be used in a manner known in the art to selectively leave spin-on matrix 416 only over the area of the die containing the invention's inductor or only between metal turns 404, 406, 408, and 410 of the invention's inductor.

The result of the spin-on process is a uniform layer of spin-on matrix 416 over the surface of the semiconductor wafer. During this process, spin-on matrix 416 is also deposited between metal turns 404, 406, 408, and 410, as shown in FIG. 7A. Thickness 418 of spin-on matrix 416 is primarily a function of the viscosity of spin-on matrix 416 as well as the spinner speed in the spin-on process described above. Thickness 418 of spin-on matrix 416 also depends on the number of high permeability particles 401 within spin-on matrix 416. The thickness of spin-on matrix 416 will increase as the viscosity of spin-on matrix 416, and the number of high permeability particles 401 increase, or as the spinner speed decreases.

As an example, with the use of a high viscosity spin-on matrix 416 in FIG. 7A, spin-on matrix 416 can have a thickness of approximately 3.0 to 4.0 microns. A thicker layer of spin-on matrix 416 results in more high permeability particles between, as well as over, metal turns 404, 406, 408, and 410. If desirable, a chemical mechanical polish ("CMP") or etch step may be used to planarize the surface of spin-on matrix 416.

FIG. 7B shows the result of a second implementation of the same step shown in FIG. 7A. However, FIG. 7B shows the result of utilizing a lower viscosity spin-on matrix 420. As a result of the lower viscosity of spin-on matrix 420, thickness 422 of spin-on matrix 420 is reduced. As an example, with the use of a low viscosity spin-on matrix 420 shown in FIG. 7B, spin-on matrix 420 can have a thickness of approximately 1.0 micron. This thinner layer of spin-on matrix 420 may be desirable to reduce fabrication costs.

FIG. 7C shows a more practical outcome of depositing a low viscosity spin-on matrix 420 as compared with FIG. 7B. As can be seen in FIG. 7C, the low viscosity spin-on matrix 420 has resulted in a thin layer of spin-on matrix between metal turns 404, 406, 408, and 410 as compared to the high viscosity spin-on matrix 416 in FIG. 7A. However, in contrast with FIG. 7B, puddles of spin-on matrix 420 remain on top of metal turns 404, 406, 408, and 410 as shown in FIG. 7C. In fact, the puddles remaining on top of metal turns 404, 406, 408, and 410 represent a practical outcome of depositing the low viscosity spin-on matrix 420. As shown in FIG. 7C that the puddles remaining on top of metal turns 404, 406, 408, and 410 are not in contact with the respective portions of the spin-on matrix 420 between the metal turns 404, 406, 408, and 410.

Figure 8:
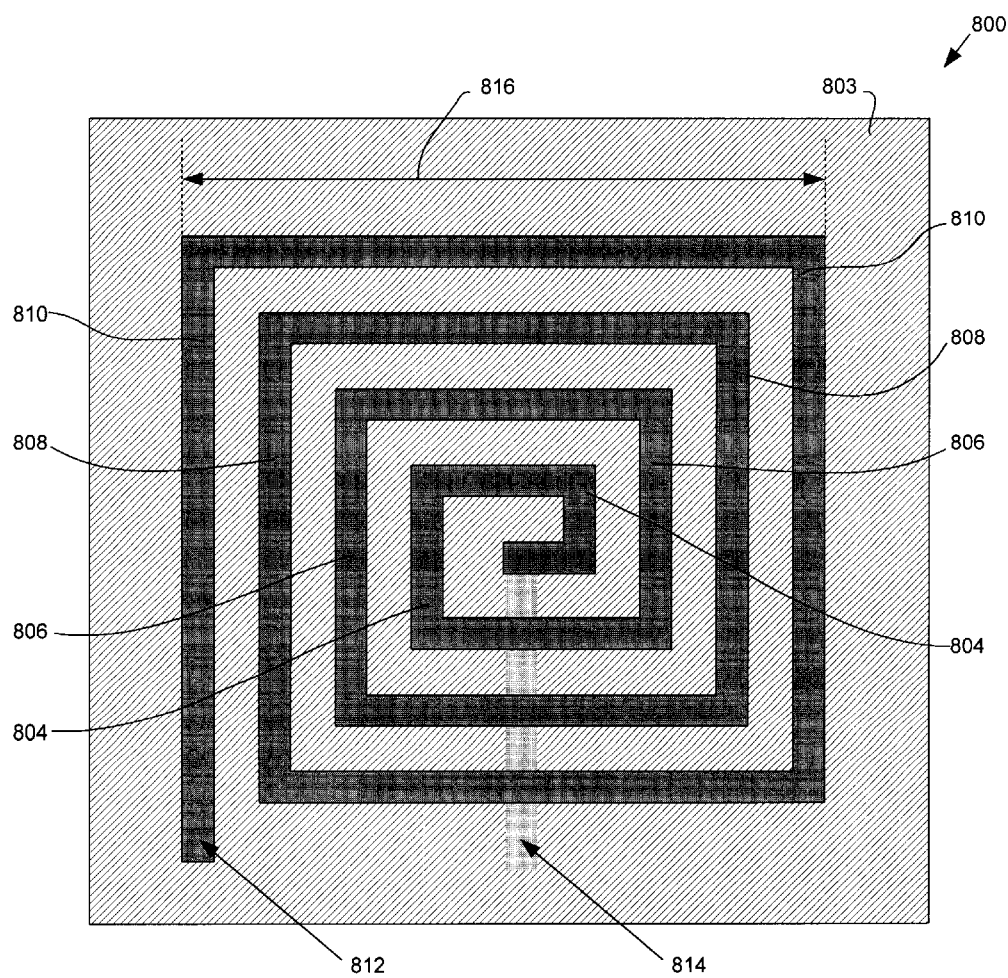
FIG. 8 illustrates a top view of the invention's inductor on an area of a semiconductor die.

In another embodiment of the invention, a damascene process is used to pattern the metal turns of the invention's inductor. FIG. 8 shows a top view of the invention's inductor 800 on an area of a semiconductor die. In this example, the inductor is also configured as a square spiral inductor. The four metal turns of inductor 800 are referred to by numerals 804, 806, 808, and 810. Metal turns 804, 806, 808, and 810 are patterned into dielectric 803 utilizing a damascene process. Dielectric 803 can be silicon dioxide or a low-k dielectric. Metal turns 804, 806, 808, and 810 can be copper, aluminum, or a copper-aluminum alloy.

Metal turns 804, 806, 808, and 810 are patterned out of one metal layer. Metal turn 810 comprises connection terminal 812. Connection terminal 812 is thus a part of inductor 800 while also functioning as a first connection terminal of inductor 800. Connection terminal 814 is also a part of inductor 800 and functions as a second connection terminal of inductor 800. However, connection terminal 814 is patterned on a different metal layer of the die than the rest of inductor 800 to allow connection terminal 814 to cross underneath metal turns 804, 806, 808, and 810 of inductor 800 without shorting the metal turns together.

An electrical connection between connection terminal 814 and metal turn 804 of inductor 800 is then provided, for example, by means of a via. Connection terminal 814 is shown in a different shade to show that it is situated on a different metal layer of the die than the remainder of the metal used to fabricate inductor 800. The width of inductor 800 is referred to in FIG. 8 by numeral 816. In the present embodiment of the invention, the metal turns of inductor 800 are patterned into the topmost metal layer of the semiconductor die using a damascene process. Although the topmost metal layer is used in the present embodiment, the invention could be implemented on any metal layer of the die.

As stated above, FIG. 8 shows a top view of the final structure of an embodiment of the invention's inductor 800 after particles of high permeability material have been deposited within the magnetic field of the inductor. FIGS. 9 through 13B illustrate the various steps of the invention's process to form the high inductance exemplary inductor 800 by showing the respective cross sections of the resulting structures after each process step.

Figure 9:
FIG. 9 illustrates a cross section view of a first dielectric situated on top of a second dielectric.
Figure 10:
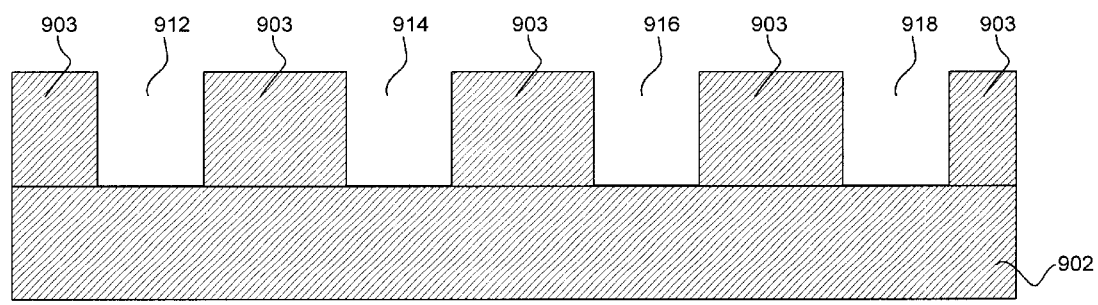
FIG. 10 illustrates a cross section view of trenches etched and patterned in a dielectric.

FIG. 9 shows the result of the first step of the invention's process in the present embodiment. The invention's process begins with a layer of dielectric 902. Another layer of dielectric 903 is laid on top of dielectric 902. In the present embodiment dielectrics 902 and 903 can be silicon dioxide or a low-k dielectric. As stated above, examples of low-k dielectrics that can be used in the present embodiment are porous silica, fluorinated amorphous carbon, aromatic hydrocarbon, carbon-doped oxide, parylene, polyarylene ether, silsesquioxane, fluorinated silicon dioxide, and diamondlike carbon. All of these dielectrics have a dielectric constant below the widely used dielectrics silicon dioxide which has a dielectric constant of approximately 4.0. FIG. 10 shows the result of the next step in the invention's process in the present embodiment. Trenches 912, 914, 916, and 918 have been etched into dielectric 903, in a manner known in the art, to form the desired square spiral pattern.

Figure 11:
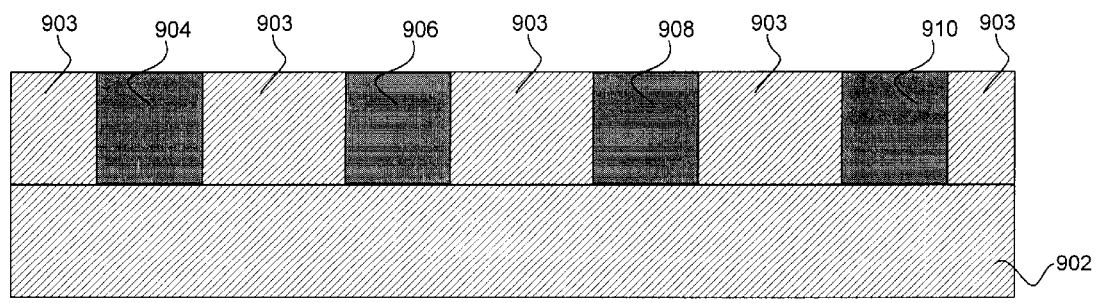
FIG. 11 illustrates a cross section view of the metal turns of the invention's inductor after metal deposition and chemical mechanical polish steps.

FIG. 11 shows the result of the next step in the invention's process. Metal, for example copper, has been deposited in a manner known in the art into trenches 912, 914, 916, and 918 to form metal turns 904, 906, 908, and 910. Although only respective cross section views of metal turns 904, 906, 908, and 910 are shown in FIGS. 11 through 13B, the cross section views of the metal turns will be referred to as metal turns 904, 906, 908, and 910 for simplicity. A CMP step has been performed to planarize the surface and remove excess metal. As a result, metal turns 904, 906, 908, and 910 are substantially flush with the surface of dielectric 903. Metal turns 904, 906, 908, and 910 in FIGS. 11 through 13B correspond to metal turns 804, 806, 808, and 810 of exemplary inductor 800 in FIG. 8. However, FIGS. 11 through 13B show only the right half of the inductor's metal turns.

Figure 12:
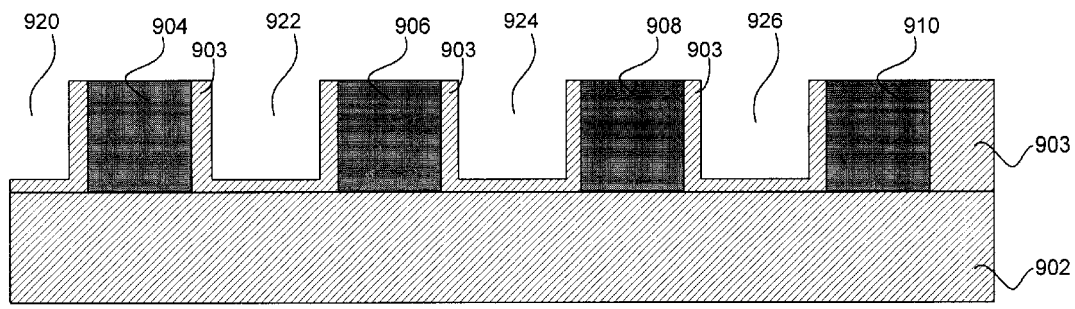
FIG. 12 illustrates a cross section view of the metal turns of the invention's inductor after trenches have been etched between the metal turns.

FIG. 12 shows the result of the next step in the process according to the present embodiment of the invention. Trenches 920, 922, 924, and 926 have been etched, in a manner known in the art, between metal turns 904, 906, 908, and 910. Trench 920 is situated in the center of the inductor and as such only a portion of trench 920 is shown in the cross section view of FIG. 12.

Figure 13A:
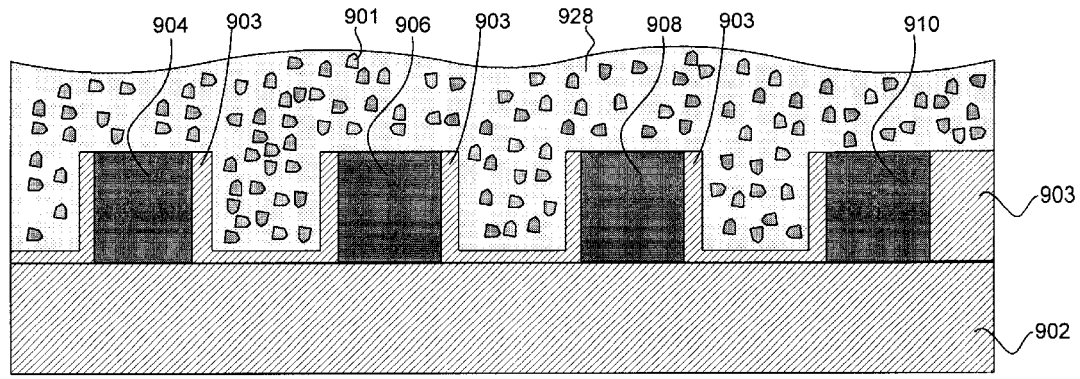
FIG. 13A illustrates a cross section view of the metal turns of the invention's inductor after the deposition of a spin-on matrix comprising high permeability particles.
Figure 13B:
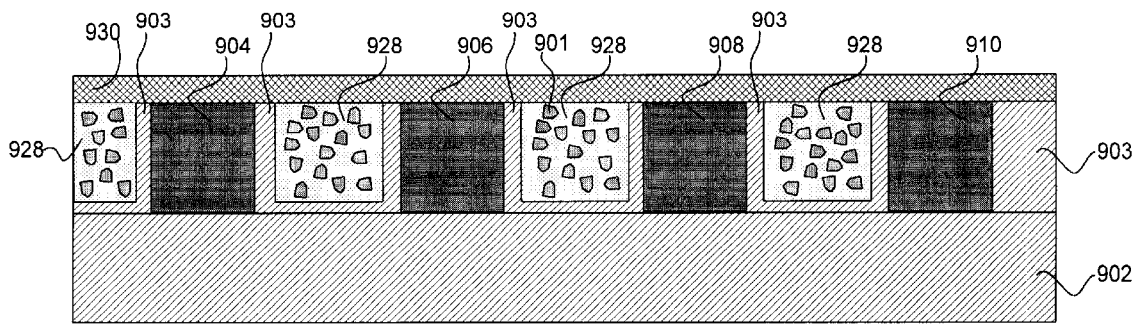
FIG. 13B illustrates a cross section view of the metal turns of the invention's inductor after the deposited spin-on matrix has been planarized by a chemical mechanical polish step and a passivation layer has been deposited over the surface of the inductor.

FIGS. 13A and 13B show the results of alternative implementations of the next step in the invention's process. FIG. 13A shows the first implementation of this step. In FIG. 13A, a high viscosity spin-on matrix 928 has been deposited over the area of the semiconductor die where the inductor is situated. Spin-on matrix 928 can be "SOG" comprising high permeability particles 901. High permeability particles 901 can be iron, nickel, nickel-iron alloy, or magnetic oxides. It is noted that portions of dielectric 903 are left on the sides of metal turns 904, 906, 908, and 910 after the etching step shown in FIG. 12. These portions of dielectric 903 provide insulation and prevent shorting between metal turns 904, 906, 908, and 910 in the event that spin-on matrix 928 comprises a large number of conductive high permeability particles.

FIG. 13B shows the result of a second implementation of the same step shown in FIG. 13A. In this second implementation, a CMP step is performed to planarize spin-on matrix 928 so that the surface of spin-on matrix 928 is substantially flush with the surface of metal turns 904, 906, 908, and 910. Passivation layer 930 is then deposited over the surface of the inductor to prevent diffusion of the metal along the surface of the semiconductor die and to provide an insulation layer. In the present embodiment, passivation layer 930 can comprise silicon nitride.

It is noted that FIGS. 13A and 13B correspond to a condition where a high viscosity spin-on matrix 928 has been utilized which is analogous to the condition in FIG. 7A. As an alternative, if a low viscosity spin-on matrix were utilized, the outcome of the process would look similar to FIGS. 7B or 7C. It is manifest to one of ordinary skill in the art that, even when a low viscosity spin-on matrix is used, a passivation layer, such as passivation layer 930, can be utilized as alternative implementations to those shown in FIGS. 13A and 13B.

Referring again to FIG. 9, in an alternative implementation of the present embodiment of the invention, dielectric 903 can be replaced by a layer of spin-on matrix. Trenches would then be etched into the layer of spin-on matrix and the etched trenches would be filled with metal to form the metal turns of the inductor. Thus, the spin-on matrix would be situated between the metal turns of the inductor after the metal deposition step. This alternative embodiment of the invention would eliminate the need for a second layer of dielectric.

In another embodiment of the invention's inductor, the high permeability spin-on matrix is deposited as a layer either underneath or on top of the metal turns of the inductor. This deposition step may be performed utilizing a spin-on process. Because the inductor's fringe magnetic field extends both above and below the inductor, the high permeability particles within the spin-on matrix deposited underneath or on top of the inductor will be within the fringe magnetic field and therefore will increase the inductance of the inductor. This embodiment of the invention can be implemented utilizing either a damascene or a subtractive etch process.

Figure 14A:
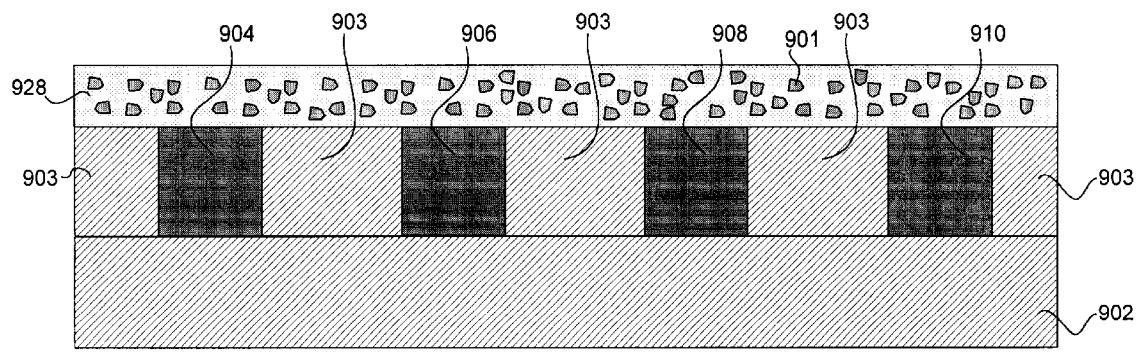
FIG. 14A illustrates a cross section view of one embodiment of the invention's inductor with a layer of spin-on matrix deposited on top of the inductor.
Figure 14B:
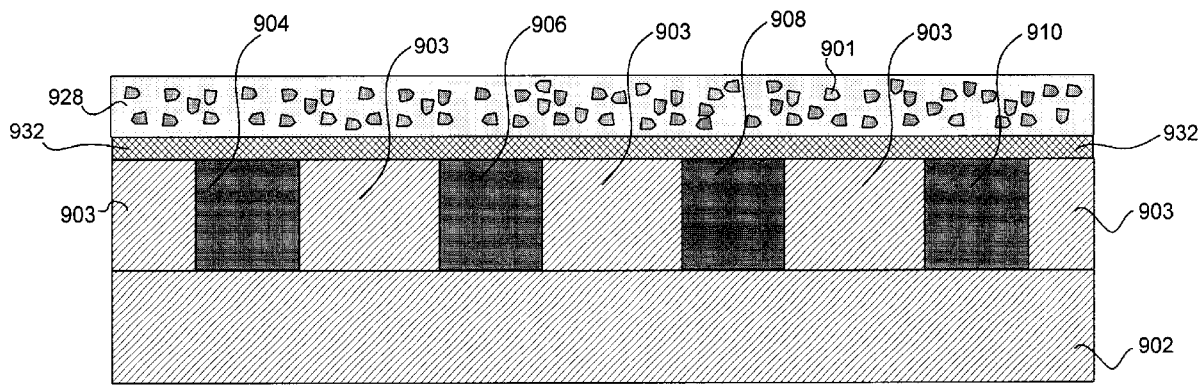
FIG. 14B illustrates a cross section view of another embodiment of the invention's inductor with a layer of spin-on matrix deposited on top of the inductor.

For example, when it is desired to deposit the spin-on matrix over the surface of the inductor, the first three steps taken can be identical to the first three steps discussed above in relation to FIGS. 9, 10, and 11. FIG. 14A shows the result of the next step in the present embodiment of the invention's process. Spin-on matrix 928 has been deposited over the surface of the semiconductor die on which the inductor is situated. A masking step in a manner known in the art can be utilized to selectively leave spin-on matrix 928 over just the area on the semiconductor die where the inductor is situated, or just between metal turns 904, 906, 908, and 910 of the inductor. As an alternative to the implementation shown in FIG. 14A, FIG. 14B shows a passivation or electrical insulation layer 932 comprising a suitable dielectric such as silicon oxide, silicon nitride, or a low-k dielectric, which is laid on top of metal turns 904, 906, 908, and 910.

Figure 15A:
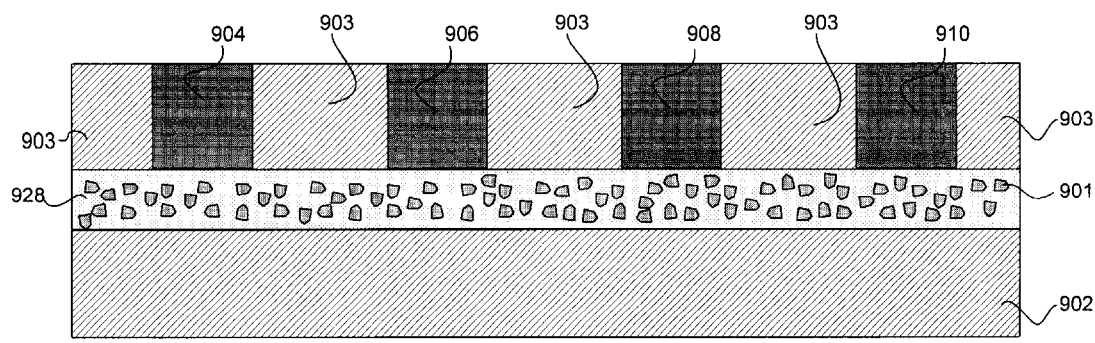
FIG. 15A illustrates a cross section view of one embodiment of the invention's inductor with a layer of spin-on matrix deposited underneath the inductor.
Figure 15B:
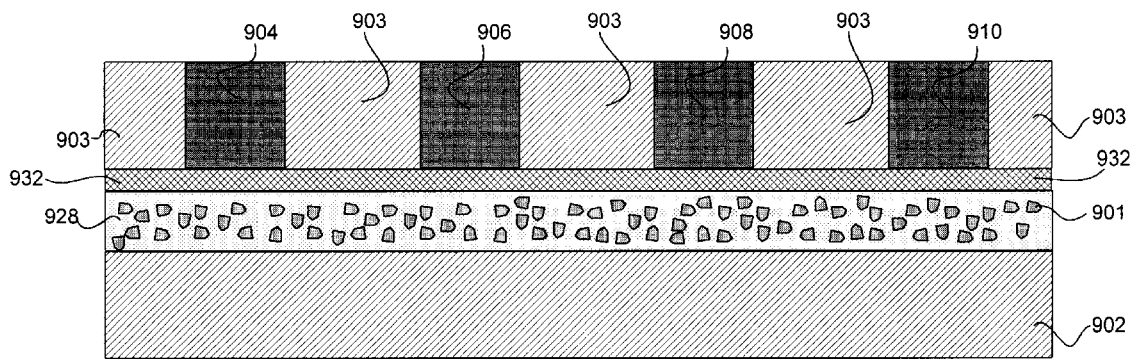
FIG. 15B illustrates a cross section view of another embodiment of the invention's inductor with a layer of spin-on matrix deposited underneath the inductor.

As another example, when it is desired to deposit the spin-on matrix under the inductor, and referring again to FIGS. 9 through 11, spin-on matrix 928 may be deposited on dielectric 902 prior to depositing dielectric 903 and fabricating metal turns 904, 906, 908, and 910. By using this method, spin-on matrix 928 will be underneath metal turns 904, 906, 908, and 910. FIG. 15A shows the result of this process. As an alternative to the implementation shown in FIG. 15A, FIG. 15B shows a passivation or electrical insulation layer 932 comprising a suitable dielectric such as silicon oxide, silicon nitride, or a low-k dielectric, which is laid below metal turns 904, 906, 908, and 910.

Both implementations of the present embodiment of the invention can also be achieved utilizing a subtractive etch process. After deposition of a blanket layer of metal, the metal turns are patterned and etched to form the desired inductor pattern, a "gap fill" process is then performed, by which the gaps between the metal lines which remain after subtractive etching are filled with a dielectric. After this step the spin-on matrix can be deposited on top of the inductor. Alternatively, before the deposition of a blanket layer of aluminum and the patterning and etching of metal turns, the spin-on matrix can be deposited on a first dielectric layer. Then an optional planarization step is performed. A blanket layer of aluminum would then be deposited on top of the spin-on matrix and the metal turns of the inductor etched and patterned.

As illustrated above, the invention results in an increase in the inductance of an on-chip inductor by placing high permeability particles within the electromagnetic field of the inductor rather than by increasing the size of the on-chip inductor, which would require a larger area of the chip to be set aside for inductors. If a very high permeability material such as a nickel-iron alloy is used, the deposition of the high permeability material within the magnetic field of the inductor will result in a significant increase in the inductance.

Moreover, because the number of metal turns does not have to be increased to achieve a higher inductance value, there is no resulting increase in the resistance of the inductor and therefore no corresponding decrease in the quality factor of the on-chip inductor. Use of the invention's inductor will enable device engineers to include significantly more of the invention's inductors on a single chip, yielding significant advantages in circuit design and resulting in greater integration of passive components on a single chip. In addition, the present invention can be easily and cost effectively implemented.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. For example, in all of the embodiments of the invention described above, the need for a CMP step or a passivation layer may be dependent on certain fabrication and design requirements. Thus, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for fabricating on-chip inductors and related structure have been described.

What is claimed is:

1. A structure in a semiconductor die, said structure comprising:
    a conductor patterned on a dielectric, said dielectric having a first permeability;
    a spin-on matrix situated next to said conductor, said spin-on matrix being a non-conducting material;
    said spin-on matrix comprising a plurality of high permeability particles, said plurality of high permeability particles having a second permeability greater than said first permeability.

2. The structure of claim 1 wherein said conductor is selected from the group consisting of aluminum, copper, and copper-aluminum alloy.

3. The structure of claim 1 wherein said conductor is patterned as a square spiral.

4. The structure of claim 1 wherein said dielectric is silicon dioxide.

5. The structure of claim 1 wherein said dielectric is a low-k dielectric.

6. The structure of claim 1 wherein said spin-on matrix comprises spin-on glass.

7. The structure of claim 1 wherein said plurality of high permeability particles are selected from the group consisting of nickel, iron, nickel-iron alloy, and magnetic oxide.

8. An inductor in a semiconductor die, said inductor comprising:
    a plurality of metal turns on a dielectric, said dielectric having a first permeability;
    a spin-on matrix situated next to said plurality of metal turns, said spin-on matrix being a non-conducting material, said spin-on matrix comprising a plurality of high permeability particles, said plurality of high permeability particles having a second permeability greater than said first permeability, whereby said spin-on matrix causes an increase in an inductance of said inductor.

9. The inductor of claim 8 wherein said plurality of metal turns comprise copper.

10. The inductor of claim 8 wherein said plurality of metal turns comprise aluminum.

11. The inductor of claim 8 wherein said plurality of metal turns comprise copper-aluminum alloy.

12. The inductor of claim 8 wherein said plurality of metal turns form a square spiral.

13. The inductor of claim 8 wherein said dielectric is silicon dioxide.

14. The inductor of claim 8 wherein said dielectric is a low-k dielectric.

15. The inductor of claim 8 wherein said plurality of high permeability particles are selected from the group consisting of nickel, iron, nickel-iron alloy, and magnetic oxide.

16. An inductor in a semiconductor die, said inductor comprising:
    a plurality of metal turns on a dielectric, said dielectric having a first permeability;
    a spin-on matrix situated next to said plurality of metal turns such that said spin-on matrix is in contact with said plurality of metal turns, said spin-on matrix being a non-conducting material, said spin-on matrix comprising a plurality of high permeability particles, said plurality of high permeability particles having a second permeability greater than said first permeability, whereby said spin-on matrix causes an increase in an inductance of said inductor.

17. The inductor of claim 16 wherein said plurality of metal turns comprise copper.

18. The inductor of claim 16 wherein said plurality of metal turns comprise aluminum.

19. The inductor of claim 16 wherein said plurality of metal turns comprise copper-aluminum alloy.

20. The inductor of claim 16 wherein said plurality of metal turns comprise copper-aluminum alloy.

21. The inductor of claim 16 wherein said plurality of metal turns form a square spiral.

22. The inductor of claim 16 wherein said dielectric is silicon dioxide.

23. The inductor of claim 16 wherein said dielectric is a low-k dielectric.

24. The inductor of claim 16 wherein said plurality of high permeability particles are selected from the group consisting of nickel, iron, nickel-iron alloy, and magnetic oxide.

\* \* \* \* \*